United States Patent [19]

Chiang

[11] 4,395,438
[45] Jul. 26, 1983

[54] LOW PRESSURE CHEMICAL VAPOR DEPOSITION OF SILICON NITRIDE FILMS

[75] Inventor: Ping-Wang Chiang, Los Gatos, Calif.

[73] Assignee: Amdahl Corporation, Sunnyvale, Calif.

[21] Appl. No.: 447,464

[22] Filed: Dec. 6, 1982

Related U.S. Application Data

[63] Continuation of Ser. No. 185,294, Sep. 8, 1980, abandoned.

[51] Int. Cl.$^3$ .................. B05D 5/12; H01L 7/44; B44C 1/22; C03C 15/00
[52] U.S. Cl. ...................... 427/94; 148/187; 156/653; 156/657; 156/659.1; 427/95; 427/255.1; 427/294
[58] Field of Search .......... 427/93, 94, 95, 248.1, 427/255.1, 255.2, 255.7, 294; 148/1.5, 187; 156/653, 657, 662, 659.1; 29/571, 580; 357/41, 43, 53

[56] References Cited

U.S. PATENT DOCUMENTS 3,549,411 12/1970 Bean et al. ........................ 427/94
4,111,724 9/1978 Ogiue et al. ..................... 156/653 X
4,279,947 7/1981 Goldman et al. ................. 427/94 X Primary Examiner—William A. Powell
Attorney, Agent, or Firm—Fliesler, Dubb, Meyer & Lovejoy

[57] ABSTRACT

A process for forming a silicon nitride layer on a semiconductor wafer in a low pressure chemical vapor deposition process. The wafer is disposed in a closed reaction chamber evacuated to a low pressure and heated to an elevated temperature in the range of about 650 to 900 degrees Centigrade. The interior of the chamber is supplied with a gaseous mixture of ammonia and a silicon compound adapted to react together with the ammonia at the elevated temperature to deposit a layer of silicon nitride on the wafer. The ammonia and the selected silicon compound have a ratio of relative concentrations in the mixture which is preselected to be in the range of 4:1 and 20:1. The silicon compound may be silane, dichlorosilane, or tetrachlorosilane. Using dichlorosilane, the preferred ratio of relative concentrations of ammonia and dichlorosilane is in the range of about 6:1 to 8:1.

10 Claims, 12 Drawing Figures

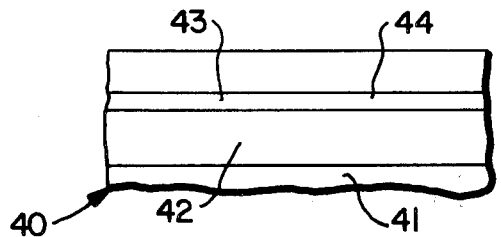

1. GROW THIN LAYER OF SILICON DIOXIDE (300–800Å)

2. DEPOSIT LAYER OF SILICON NITRIDE (900–2000Å)

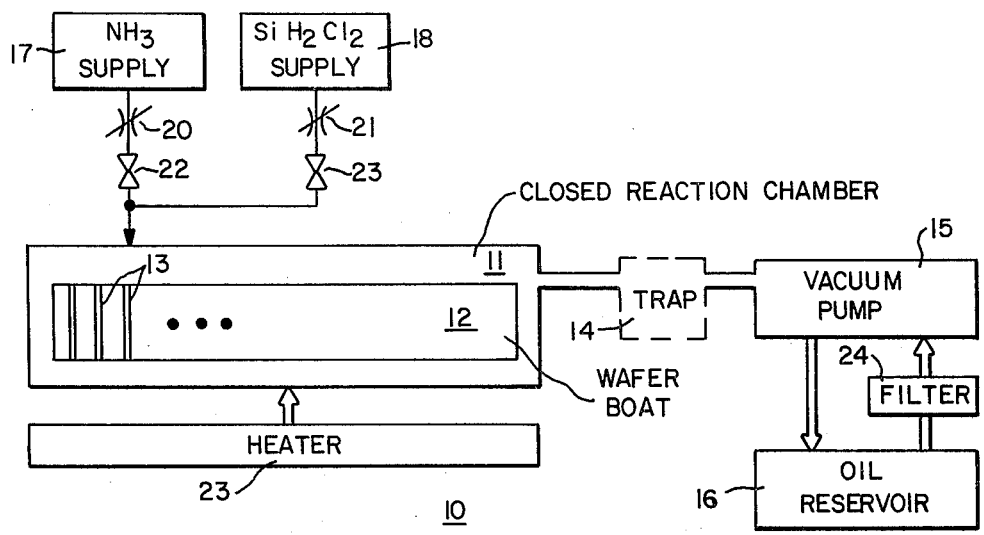

FIG.-1 (PRIOR ART)

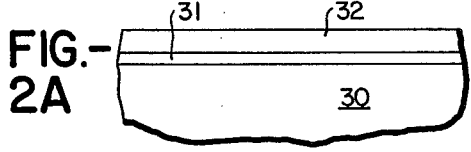

FIG.-2A

1. GROW THIN LAYER OF SILICON DIOXIDE (300-800Å)

2. DEPOSIT LAYER OF SILICON NITRIDE (900-2000Å)

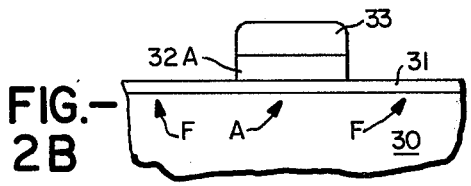

FIG.-2B

3. FORM PHOTO RESIST MASK PATTERN AND ETCH NITRIDE IN FIELD REGIONS

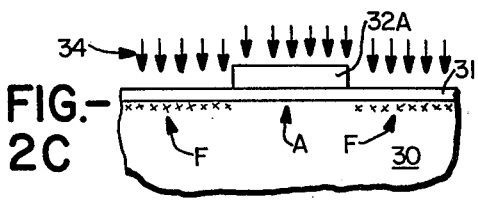

FIG.-2C

4. REMOVE PHOTORESIST

5. IMPLANT FIELD REGION WITH P-TYPE DOPANT (EG, BORON) USING NITRIDE TO MASK ACTIVE REGION

6. GROW THICK FIELD OXIDE USING NITRIDE TO MASK ACTIVE REGION

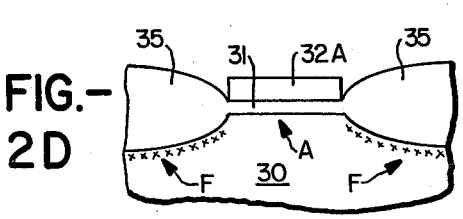

FIG.-2D

7. ETCH NITRIDE AND OXIDE FROM ACTIVE REGION AND FORM AND DEVICES THEREAT

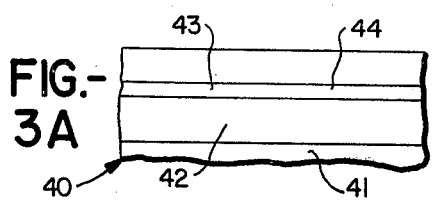

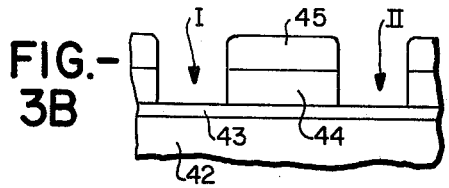

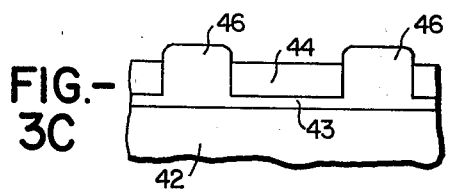

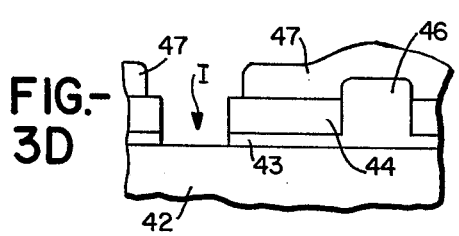

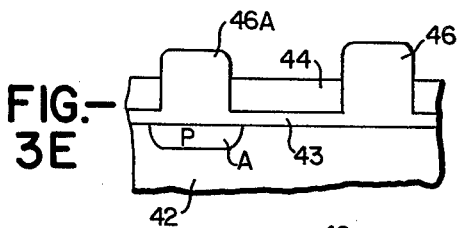

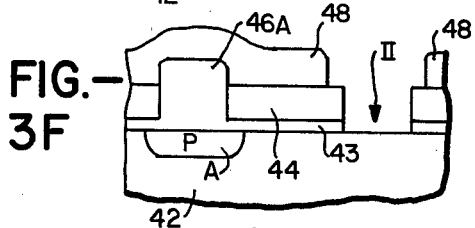

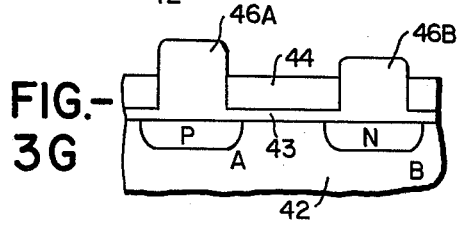

1. GROW THIN LAYER OF SILICON DIOXIDE (300-800Å)

2. DEPOSIT LAYER OF SILICON NITRIDE (900-2000Å)

3. FORM 1ST PHOTO RESIST MASK PATTERN AND ETCH NITRIDE TO DEFINE APERTURE PATTERNS I AND II

4. REMOVE PHOTORESIST

5. GROW OXIDE IN APERTURE PATTERNS I AND II

6. FORM 2ND PHOTO RESIST MASK PATTERN AND ETCH OXIDE TO REOPEN APERTURE PATTERN I

7. REMOVE PHOTO RESIST

8. DIFFUSE P-TYPE DOPANT INTO SUBSTRATE REGION A AND REGROW OXIDE IN APERTURE PATTERN I

9. FORM 3RD PHOTO RESIST MASK PATTERN AND ETCH OXIDE TO REOPEN APERTURE PATTERN II

10. REMOVE PHOTO RESIST

11. DIFFUSE N-TYPE DOPANT INTO SUBSTRATE REGION B

LOW PRESSURE CHEMICAL VAPOR DEPOSITION OF SILICON NITRIDE FILMS

This is a continuation of Ser. No. 185,294, filed Sept. 8, 1980, abandoned.

This invention relates in general to methods of manufacturing semiconductor integrated circuits and, in particular, to semiconductor processes which utilize, in one or more stages of the process, a silicon nitride layer as a diffusion, oxidation, or implant masking layer.

In the early years of semiconductor integrated circuit manufacturing, it was common to use a relatively thick layer of silicon oxide (typically silicon dioxide) as a masking layer when selective diffusion of a dopant material into the wafer substrate was performed. For adequate diffusion masking, the layer of silicon oxide had to be at least more than one microns thick in order to have a sufficient masking capability. Generally this thick silicon oxide layer was grown on the substrate either in a dry or steam oxidation process. Later it was discovered that a deposited layer of silicon nitride generally had better characteristics for serving as a diffusion mask. Because of the greater density of silicon nitride, a thinner layer could be successfully employed as a masking layer. Moreover, in several types of semiconductor processes, the use of a silicon nitride layer in conjunction with a thin silicon oxide layer directly on the substrate enabled certain process advantages to be achieved due to the differential etch rate characteristics of the oxide and nitride layers for certain selective etchants.

The formation of a layer of silicon nitride on a semiconductor wafer generally involved a chemical vapor deposition process in which a vaporized or gaseous silicon compound was reacted with ammonia to form the silicon nitride layer. Originally this chemical vapor deposition process was carried out in an epi reactor. It was called an epi reactor because it had been initially developed to carry out a process of forming an epitaxial layer of silicon on a raw silicon substrate. Chemical vapor deposition of silicon nitride in an epi reactor was a process difficult to control with respect to such parameters as the deposition rate of the nitride layer and the physical and characteristics of the layer produced such as layer thickness uniformity. With these process control difficulties, yield rates were generally low and adversely impacted the yield of the overall integrated circuit manufacturing process.

About ten years ago, an open tube furnace system for carrying out the chemical vapor deposition of silicon nitride was developed. In this open tube furnace system, the nitride films were chemically deposited at one atmosphere of pressure, generally using nitrogen as the carrier gas to transport the reactant gasses into the reaction chamber. At this time the most common silicon compound utilized was silane ($SiH_4$) and the ammonia to silane ratio utilized in the reaction ranged from around 100:1 to 1000:1. While the open tube furnace system for carrying out the chemical vapor deposition of silicon nitride films was somewhat easier to control than the reactor system, it still gave problems from the standpoint of the uniformity and reproducibility of the silicon nitride films deposited.

Within the past several years, a new approach to silicon nitride deposition has been developed and is generally referred to as the low pressure chemical vapor deposition (LPCVD) system. The LPCVD system is superior to the earlier systems because of its lower cost and its capability of reproducibility depositing films of uniform thickness and high physical integrity (i.e., absence of pin holes). Gradually over the last several years, more and more semiconductor manufacturers have shifted to the LPCVD system for depositing silicon nitride layers to serve as masking layers against diffusion or implantation of doped regions in a semiconductor substrate.

FIG. 1 of the attached drawing shows schematically the general components of an LPCVD system 10 for forming silicon nitride films. Generally the LPCVD system 10 utilizes a closed reaction chamber 11 into which is introduced a wafer boat 12 which carries a plurality of semiconductor wafers 13. Reaction chamber 11 will have a door system through which the wafer boat 12 can be inserted and then resealed to form a vacuum tight enclosure. Reaction chamber 11 is evacuated by way of a vacuum pump 15 and is heated by a heater system 23. The reactant gasses are introduced into the system at a location where these gasses will flow over the heated wafers in the wafer boat 12 before passing out of the reaction chamber 11 into the vacuum pump 15. As shown in FIG. 1, a supply tank 17 of ammonia ($NH_3$) and a tank 18 of a silicon compound (e.g. dichlorosilane ($SiH_2 Cl_2$)) are provided, with the gasses communicated into reaction chamber 11 through separate flow controllers 20 and 21, and valve arrangements 22 and 23. These arrangements control the relative rates of flow of the constituent reactant gasses into reaction chamber 11 to control the reactant gas ratio. In FIG. 1 the silicon compound used in the reaction is dichlorosilane since that is the silicon compound which is presently preferred in the art. However, the chemical vapor deposition of silicon nitride can also be carried out using silane which is ($SiH_4$) or tetrachlorosilane ($SiCl_4$). For convenience, all of these compounds will be referred to generally as silane.

In the prior art, the LPCVD process of forming a silicon nitride film has usually been carried out with an ammonia to silane ratio of about 100:1 although, to some extent, the art has been reducing the ratio so that some manufacturers are using ratios in the range of 40:1 to 60:1. These ammonia to silane ratios produce LPCVD silicon nitride films with satisfactory diffusion masking characteristics, but they also tend to create problems with the vacuum equipment in the LPCVD system due to the high residual ammonia in the exhaust products which tends to quickly contaminate the vacuum pump oil and also due to by-products precipitating out and plugging the exhaust gas path. Initially this contamination problem was so severe that only two or three batches of wafers could be processed in the LPCVD system before the vacuum apparatus would fail. To ameliorate the contamination problem, the industry devoted effort to designing traps to prevent contaminants from the reaction chamber reaching the vacuum pump. A trap 14 is shown schematically in FIG. 1 as optionally interposed between reaction chamber 11 and vacuum pump 15. The difficulty with deploying such a trap was that the more successfully it trapped the contaminants the more quickly it clogged itself and needed cleaning or replacement. Removing the trap to clean it or replace it involved breaking the vacuum line to the vacuum pump which, in itself, can create problems since sometimes when the system is reconnected, leaks in the vacuum apparatus have developed.

An alternative approach to reduce the problem was to provide an oil reservoir (such as reservoir 16 shown in FIG. 1) for the vacuum pump. This oil reservoir, which might contain as much as five or ten gallons of vacuum pump oil recirculated through a filter 24 into the oil sump of the pump 15, would permit a larger number of nitride deposition runs to be carried out before the oil would have to be changed. While the oil reservoir approach has generally ameliorated the problem of contamination to the extent that a substantial number of production runs of nitride deposition can be performed before changing the oil, it would be preferable to reduce the problem of contamination either to reduce the frequency of changing the oil in the reservoir or to eliminate the need for a reservoir altogether.

It is a principal object of this invention to provide an improved LPCVD process for forming a layer of silicon nitride on a semiconductor wafer.

More specifically, it is an object of this invention to provide an improved method for operating a LPCVD furnace system for depositing silicon nitride.

It is another object of this invention to provide an improved process for forming a diffusion or implant masking pattern on a semiconductor wafer.

It is a further object of this invention to provide an improved self-aligned bipolar semiconductor process using silicon nitride as a diffusion masking layer.

To achieve the above-stated objects, this invention features an improved process for forming on a semiconductor wafer a high quality layer of silicon nitride adapted to be patterned and to serve as a mask for diffusion or implantation of selected impurities into selected regions of the wafer. In this process the wafer is exposed in a closed reaction chamber evacuated to a low pressure and heated to an elevated temperature in the range of about 650 to 900 degrees Centigrade. The interior of the closed reaction chamber is then supplied with a gaseous mixture of ammonia and a silicon compound which is adapted to react together with the ammonia at the elevated temperature gradually to deposit a layer of silicon nitride on the wafer. In accordance with this invention, the ammonia and the selected silicon compound are supplied to the chamber in a ratio of relative concentrations which is preselected to be in the range of 4:1 and 20:1. The silicon compound used in the process is selected from the group consisting of silane, dichlorosilane, and tetrachlorosilane. Preferably, the silicon compound is dichlorosilane and with the use of dichlorosilane, the preferred ratio of relative concentrations of the ammonia and dichlorosilane in the reactant gas mixture is in the range of about 6:1 to 8:1.

The process of this invention for forming a high quality layer of silicon nitride is generally useful in semiconductor integrated circuit processes which require a high quality diffusion or implant masking pattern on the wafer. The method of forming a LPCVD silicon nitride layer in accordance with this invention is also especially useful in a self-aligned bipolar process in which a patterned layer of silicon nitride must withstand two diffusion steps and the etching and other steps which accompany the diffusion steps.

When the LPCVD process for forming silicon nitride is performed in accordance with this invention, the reduced ammonia to silane ratio greatly lowers the rate of contamination of the vacuum system in the LPCVD furnace while maintaining the formation of a high quality nitride layer. When the process of this invention is used, there is no necessity for a trap to be deployed in the vacuum system between the closed reaction chamber and the vacuum pump. The necessity for using an oil reservoir to enable the performance of multiple production runs before changing the oil is also eliminated. With the method of this invention an LPCVD furnace system can be operated for an entire production shift of seven or eight hours without requiring an oil change even in the absence of an oil reservoir. Typically, without an oil reservoir the oil in the vacuum pump would be changed at the beginning or end of each shift. Optionally, an oil reservoir can be provided so that less frequent oil changes will be required. Accordingly, with an oil reservoir the lifetime of the total oil supply for the vacuum pump is dramatically increased utilizing the LPCVD process of this invention with its lower ammonia to silane ratios.

Other objects, features, and advantages of this invention will be apparent from a consideration of the following description taken in conjunction with the accompanying drawings.

FIG. 1 is a schematic drawing of the typical elements of a LPCVD furnace system in which the silicon nitride deposition process of this invention may be carried out.

FIGS. 2A to 2D illustrate a portion of a semiconductor process for forming n-channel silicon gate integrated circuits which the process of this invention may be advantageously employed to form a high quality silicon nitride masking layer.

FIGS. 3A to 3G illustrate portions of the process steps used to form a bipolar integrated circuit in which the silicon nitride deposition process of this invention is employed to form a silicon nitride layer which serves as a masking layer used in forming self-aligned different-doped regions in a semiconductor wafer.

The silicon nitride deposition process in accordance with this invention may be carried out in an LPCVD system substantially like that depicted in FIG. 1, except that a trap 14 is not required (although it may be employed if desired) and an oil reservoir 16 is not required (although it may also optionally be included). To operate the system of FIG. 1 in accordance with this invention, semiconductor wafers 13 carried in wafer boat 12 are disposed in closed reaction chamber 11 which is then evacuated to a low pressure in the range of about 200 milliTorr to 1 Torr. A convenient pressure at which to operate is 250 milliTorr. The closed reaction chamber 11 is heated to an elevated temperature in the range of about 650 to 900 degrees Centigrade with a temperature of about 800 degrees Centigrade being a convenient operating temperature setting. Generally, in accordance with standard practice, the wafer boat 12 would be slowly introduced into the heated reaction chamber or the reaction chamber would be slowly heated to avoid thermal shock to the wafer 13. After the wafers in the wafer boat have been brought up to temperature, the interior of the closed reaction chamber 11 is supplied with a gaseous mixture of ammonia and dichlorosilane from the supply tanks 17 and 18, respectively.

In accordance with this invention, the flow controllers 22 and 23 which control the rate of supply of the reactants to the reaction chamber will be set to provide a ratio of relative concentrations of ammonia and dichlorosilane in the mixture in the range of 4:1 and 20:1. Preferably, for good quality nitride layers and low rate of contamination of the vacuum pump system, the ammonia to dichlorosilane ratio should be in the range of about 6:1 to 8:1. To supply the reactant gasses in this ratio of concentrations, the dichlorosilane may, for example, be supplied to the reaction chamber at a rate of about fifty cubic centimeters per minute and the ammonia at a rate of about three hundred cubic centimeters per minute for an ammonia to dichlorosilane ratio of 6:1. It should be understood that the rate of gas supply to the reaction chamber is somewhat dependent on the size of the chamber since there is no need to supply more reactant gasses to the chamber than can be effectively utilized in depositing a nitride layer on the wafers 13.

Using the exemplary process conditions stated above, a layer of silicon nitride is deposited at a rate of about 100 Angstroms per minute so that approximately ten minutes are required to deposit a film thickness of about 1000 Angstroms. Utilizing the exemplary process conditions set forth above, the uniformity of the thickness of the nitride film can be maintained within about five percent of the total film thickness. Furthermore, the overall process of operating the LPCVD system in accordance with this method produces a high yield of high integrity silicon nitride films on the wafers processed in the system.

It should be understood that the process conditions used for operating the LPCVD furnace to deposit silicon nitride are given by way of example and certain alternative approaches could also be taken. For example, instead of using dichlorosilane, the silicon compound employed could be silane ($SiH_4$) and the silane may be diluted with a carrier gas such as Argon. However, dichlorosilane is preferred because it is a much safer compound to use. Silane is a self-igniting compound when it comes in contact with air whereas dichlorosilane is not. It would also be possible to use tetrachlorosilane; but, although the nitride layer formed using tetrachlorosilane is a high quality one, this compounds tends to be harder on the vacuum pump system and the reaction with the ammonia to form silicon nitride is slower than that with silane or dichlorosilane. This slow reaction would generally force an increase in deposition temperature to achieve a sufficient reaction rate (i.e., silicon nitride deposition rate) and an increase in temperature would put further stress on the LPCVD system. For these reasons dichlorosilane is generally considered by the industry to be the preferred reactant gas in this type of process.

Using the process parameters in accordance with this invention to form silicon nitride in the LPCVD process enables the equipment to be operated without a trap 14 or oil reservoir and easily run fifteen or so production runs during an eight-hour production shift with a change of oil between shifts. Optionally, if an oil reservoir is provided the oil need not be changed for a number of shifts. The oil change cycle is substantially longer using the process parameters of this invention with lower ammonia to silane ratios than is required when the prior art higher ammonia to silane ratios in excess of 40:1 are employed.

Further lowering of the ammonia to silane ratio is not consistent with producing a satisfactory nitride layer. At ammonia to silane ratios below about 4:1 the silicon nitride layer produced begins to lose its diffusion masking ability. In other words, after the diffusion process has been performed, spots of the diffused materials exist in the wafer underneath the silicon nitride layer, and these diffused spots can cause various transistor leakage problems and reduce the semiconductor fabrication yield. It is believed that the diffused spots are produced as a result of the silicon nitride layer containing silicon-rich regions which do not mask against diffusion. Maintaining the ammonia to silane ratio higher than about 4:1 generally eliminates the deleterious production of diffused spots on the wafer, and maintaining the ammonia to silane ratio below about 20:1 minimizes the LPCVD equipment problems caused by rapid contamination of the vacuum pump system.

FIGS. 2A to 2D illustrate the use of a high quality silicon nitride layer as both an implant masking layer and an oxide growth masking layer in a semiconductor process for fabricated integrated circuits with n-channel field effect transistor devices. The process generally depicted in FIGS. 2A to 2D is sometimes called a dielectrically isolated silicon gate process because of the formation of thick layers of dielectric in the field region of the device to electrically isolate the active devices formed at the active regions in the semiconductor substrate.

The silicon gate process generally begins with the first step of growing a thin layer of silicon dioxide 31 on the surface of the semiconductor wafer 30 which may be a bulk semiconductor substrate or a substrate with an epitaxial layer of silicon formed thereon. Other forms of raw wafers such as silicon on sapphire could also be utilized. Generally the silicon dioxide layer 31 is grown to a thickness of between 300 and 800 Angstroms. The next step shown in FIG. 2A is to deposit a masking layer of silicon nitride 32. This deposition step is carried out in accordance with the process parameters of this invention in the LPCVD system generally disclosed in FIG. 1. The silicon nitride layer is typically deposited to a thickness of between 900 and 2000 Angstroms.

As depicted in FIG. 2B, the next step is to form a photoresist mask pattern generally designated 33 on the wafer over the silicon nitride layer 32 and then to etch the nitride layer out of the field regions F of the wafer 30. It should be understood that FIG. 2B illustrates only one small section of the overall wafer and on each wafer there will be literally thousands of active regions A separated by field regions F.

With the field regions F defined by the areas on the wafer from which the nitride layer has been removed, photoresist layer 33 is removed. Next, the field regions F are implanted with a p-type dopant (e.g., boron) using the remaining sections 32A of the nitride layer as a mask for the active region A as depicted in FIG. 2C. Typically, the implanting of the field region is done in an ion implantation process although it can also be done in a short diffusion cycle. Using the ion implantation process, typically the thin layer of oxide 31 is left on the substrate 30 and the p-type dopant ions are implanted through the oxide layer into the surface of the substrate.

As depicted in FIG. 2D, the next step is to grow a thick field oxide in the field regions F using the residual patterned nitride layer 32A as a mask against oxide growth in active region A. After the field oxide has been grown, the patterned nitride layer 32A etching and the thin oxide layer 31 in the active region A are etched away. With the surface of the semiconductor substrate 30 exposed in the active region, field effect transistor devices and other structures are formed in this region using standard silicon gate, field effect device processing steps which are well known in the art and need not be described here.

In the process described above, it is important that the layer of silicon nitride used both as an implant mask and as an oxide growth mask for the active region A be a high integrity layer in order to protect the active region against contamination with field region dopants which could otherwise reduce the yield of the overall semiconductor process. It will be appreciated that since the step of depositing the layer of silicon nitride is an early step in the silicon gate integrated circuit process, wafer throughput in this part of the process is important in determining the overall wafer throughput of a production facility. Accordingly, it is preferable to be able to run the LPCVD system for deposition of silicon nitride throughout at least an entire shift (if an oil reservoir is not utilized) or through many shifts of production (if an oil reservoir is used) to avoid the LPCVD furnace system being a limitation on the wafer throughput of the facility. Of course, it is always possible to use redundant equipment to achieve the desired wafer throughput, but this approach would add considerable additional expense to the production of the integrated circuits. Accordingly, utilizing the process parameters of this invention to enable the LPCVD system to be utilized over a long period of time without downtime is an important contribution to reducing the cost of achieving a desired level of wafer throughput in an intergrated circuit production facility.

FIGS. 3A to 3G illustrate the use of a high quality silicon nitride layer as both a diffusion masking layer and an oxide growth masking layer in a semiconductor process for fabricating integrated circuits with bipolar transistor devices. The process generally depicted in FIGS. 3A to 3G is called a self-aligned process because the alignment (i.e., separation distance) between respective first and second differently doped regions in the semiconductor wafer is established by a single masking pattern formed in a nitride layer deposited on the wafer. Leading up to the process step depicted in FIG. 3A, a number of prior processing steps will have been performed on the wafer to achieve a partial circuit structure. Some of these processing steps may also have utilized a layer of silicon nitride as the masking layer against implantation or diffusion of dopants into the wafer.

The process steps depicted in FIGS. 3A to 3G relate solely to a portion of the overall bipolar integrated circuit fabrication sequence wherein differently diffused regions in the substrate are required. The differently diffused regions may be either regions doped with different dopant materials or they might be regions doped with the same type of dopant material but with different concentrations. For convenience of explanation the process steps depicted in FIGS. 3A to 3G will be described as directed toward creating separated regions in the wafer having respective p-type and n-type dopants diffused therein.

The relevant portion of the self-aligned bipolar process begins with a first step of growing a thin layer of silicon dioxide 43 on the surface of semiconductor wafer 30 which may be a simple bulk semiconductor substrate or, more typically with bipolar devices, an epitaxial layer 42 provided on a silicon substrate 41. Generally the silicon dioxide layer is grown to a thickness of between 300 and 800 Angstroms. The next step also depicted in FIG. 3A is to deposit a layer of silicon nitride to a thickness in the range of 900 to 2000 Angstroms. This nitride deposition step is carried out in accordance with the process parameters of this invention in the LPCVD system generally depicted in FIG. 1. The quality of this nitride layer is crucial to the obtaining of a satisfactory yield in the overall bipolar process.

As depicted in FIG. 3B, the next step is to form a first photoresist mask pattern 45 and then to etch the nitride layer 44 to define aperture patterns I and II. It should be understood that, although FIG. 3B depicts only one aperture in each of the patterns, the other sections of the wafer would have numerous apertures forming an overall aperture pattern I and aperture pattern II. At this stage the aperture patterns I and II appear identical and will only be separated in function at a later photomasking step in the process. The step of etching the nitride will typically be carried out with with hot phosphoric acid which is a selective etchant for the nitride and will not attack substantially the thin oxide layer 43 under the aperture patterns I and II.

As depicted in FIG. 3, the next steps in the process involve removing the photoresist layer 45 and then growing a thick oxide layer in the aperture patterns I and II. Preferably, this thick oxide layer which eventually must serve as a diffusion mask is grown to a thickness of at least about 3 microns.

FIG. 3D depicts the next step in the process as forming a second photoresist mask pattern and then performing a selective oxide etch to reopen aperture pattern I. As shown in FIG. 3D, the photoresist pattern covers all of the areas on the wafer corresponding to aperture pattern II and provides photoresist mask openings to regions corresponding with aperture pattern I. By using hydrofluoric acid as a selective oxide etch, the thick oxide layer in aperture patterns I is etched away including the initial thin oxide layer 43. Accordingly, the bare substrate is now exposed after this step has been performed.

FIG. 3E depicts the next steps as removing the photoresist layer 47 shown in FIG. 3D and then diffusing a p-type dopant (e.g., boron) into substrate region A to form a p-type doped region. This diffusion may be carried out in a standard diffusion furnace and oxygen will be permitted in the furnace during the diffusion to regrow the thick oxide layer 46A in aperture pattern I.

FIG. 3F depicts the next steps in the process which involve forming a third photoresist mask pattern 48 and then performing a selective oxide etch to reopen aperture pattern II all the way to the surface of the wafer. As depicted in FIG. 3G the next steps involve removing photoresist layer 48 and then diffusing an n-type dopant into substrate region B through aperture pattern II. A thick oxide layer 46B will regrow in aperture pattern II as the diffusion process takes place. Having created the separated differentially doped regions A and B in the substrate, the remainder of the process is continued to complete the overall integrated circuit structure in a well-known manner.

In the above-described bipolar process, each time a layer of silicon nitride is used as an implant mask and/or an oxide growth mask, this layer must be of high integrity in order to protect the wafer regions thereunder from receiving any of the dopant material which could then cause various transistor leakage problems in the finished integrated circuit. The integrity of the nitride layer is especially important in the process steps described above for the self-aligned bipolar process since the layer is subjected to two diffusion steps.

Utilizing the LPCVD process parameters for silicon nitride deposition in accordance with this invention improves the overall performance of a production facility carrying out a bipolar integrated circuit process because it enables the achievement of high yields at the silicon nitride deposition stage without a substantial adverse impact on the LPCVD furnace system importantly involved in the processing. Accordingly, the process parameters of this invention contribute to reducing the cost of achieving a desired level of wafer throughput in an integrated circuit production facility.

The above embodiments of the process in accordance with this invention are given by way of example of the general principles and concepts involved in the invention. It is recognized that persons of skill in the art could make numerous changes without departing from the scope of the invention as set forth in the following claims.

What is claimed is:

1. In a process for forming on a semiconductor wafer a high quality layer of silicon nitride adapted to be patterned and to serve as a mask for diffusion or implantation of selected impurities into selected regions of said wafer, the steps of:
   disposing said wafer in a closed reaction chamber evacuated to a pressure less than about 1 Torr and heated to an elevated temperature in the range of about 650 to 900 degrees Centigrade;
   supplying to the interior of said chamber a gaseous mixture comprising primarily ammonia and a silicon compound adapted to react together with said ammonia at said elevated temperature gradually to deposit said layer of silicon nitride on said wafer at a deposition rate greater than approximately 50 Angstroms per minute, said silicon compound having a flow rate of greater than approximately 12 cubic centimeters per minute, said ammonia and said selected silicon compound having a ratio of relative concentrations in said mixture preselected to be in the range of 4:1 and 20:1.

2. The process of claim 1, wherein said silicon compound is selected from the group consisting of silane, dichlorosilane, and tetrachlorosilane.

3. A method of operating a low pressure furnace system for depositing a layer of silicon nitride with sufficient integrity to serve as an effective mask while doping selected regions of a semiconductor layer on a wafer without rapidly contaminating the oil in a vacuum pump used to evacuate a closed reaction chamber in said furnace, said method comprising the steps of:
   disposing said wafer in said closed reaction chamber heated to an elevated temperature in the range of about 650 to 900 degrees Centigrade;
   evacuating said reaction chamber by means of said vacuum pump to a pressure in the range of about 100 milliTorr to 1 Torr.
   supplying to the interior of said reaction chamber a gaseous mixture comprising primarily ammonia and a silicon compound adapted to react together with said ammonia at said elevated temperature gradually to deposit a layer of silicon nitride on said wafer to a thickness in the range of about 900 to 2000 Angstroms at a deposition rate greater than approximately 50 Angstroms per minute, said silicon compound having a flow rate of greater than approximately 12 cubic centimeters per minute, said ammonia and said silicon compound having a ratio of relative concentrations in said gaseous mixture preselected to be in the range of 6:1 and 8:1.

4. The process of claim 3, wherein said silicon compound is selected from the group consisting of silane, dichlorosilane, and tetrachlorosilane.

5. In a process for forming a diffusion or implant masking pattern on a semiconductor wafer, the steps of:
   forming a layer of silicon oxide on the surface of said wafer;
   depositing a layer of silicon nitride on said layer of said silicon oxide; and
   forming a pattern of apertures in said layer of silicon nitride to serve as said diffusion or implant mask pattern; said step of depositing said nitride layer comprising:
   disposing said wafer in a closed reaction chamber evacuated to a pressure less than about 1 Torr and heated to an elevated temperature in the range of about 650 to 950 degrees Centigrade;
   supplying to the interior of said chamber a gaseous mixture comprising primarily ammonia and a silicon compound adapted to react together with said ammonia at said elevated temperature gradually to deposit said layer of silicon nitride on said wafer at a deposition rate of approximately 100 Angstroms per minute, said silicon compound having a flow rate of approximately 50 cubic centimeters per minute, said ammonia and said silicon compound having a ratio of relative concentrations in said mixture preselected to be in the range of 6:1 and 8:1.

6. The process of claim 5, wherein said silicon compound is selected from the group consisting of silane, dichlorosilane, and tetrachlorosilane.

7. The process of claim 5, wherein said silicon compound is dichlorosilane and said ratio of relative concentrations of ammonia and dichlorosilane is preselected to be in the range of 6:1 to 8:1.

8. In a self-aligned bipolar process for forming separated and differently doped first and second regions in a semiconductor wafer, the steps of:
   forming a layer of silicon oxide on the surface of said wafer;
   depositing a layer of silicon nitride on said layer of silicon oxide to a thickness in the range of about 900 to 2000 Angstroms;
   forming by way of a first photomask pattern and etching operation a pattern of separated aperture in said layer of silicon nitride to serve as a mask pattern for all of said differently doped regions;
   growing a thick layer of silicon oxide on said wafer in all of said apertures in said layer of silicon nitride;
   forming by way of a second photomask pattern and selected oxide etching operation a first subpattern of said separated apertures in said layer of silicon nitride to serve as a mask aperture pattern for said first regions in said wafer;
   doping said first regions through said first subpattern of apertures in said silicon nitride layer;
   regrowing a thick layer of silicon oxide on said wafer in said first subpattern of apertures;
   forming by way of a third photomask pattern and selective oxide etching operation a second subpattern of said separated apertures in said layer of silicon nitride to serve as a mask aperture pattern for said second regions in said wafer; and
   doping said second regions through said second subpattern of apertures; said step of depositing said layer of silicon nitride comprising:
   disposing said wafer in a closed reaction chamber evacuated to a low pressure and heated to an elevated temperature in the range of about 650 to 900 degrees Centigrade;

supplying to the interior of said tube a gaseous mixture of ammonia and a silicon compound adapted to react together with said ammonia at said elevated temperature to deposit said layer of silicon nitride on said wafer, said ammonia and said selected silicon compound having a ratio of relative concentrations in said mixture preselected to be in the range of about 4:1 and 20:1.

9. The process of claim 8, wherein said silicon compound is selected from the group consisting of silane, dichlorosilane, and tetrachlorosilane.

10. The process of claim 8, wherein said silicon compound is dichlorosilane and said ratio of relative concentrations of ammonia and dichlorosilane is preselected to be in the range of about 6:1 to 8:1.

* * * * *